United States Patent [19]

Freed

[11] Patent Number: 4,472,662
[45] Date of Patent: Sep. 18, 1984

[54] DEFLECTION CIRCUIT

[75] Inventor: Karol Freed, Thousand Oaks, Calif.

[73] Assignee: Terminal Data Corporation, Woodland Hills, Calif.

[21] Appl. No.: 515,817

[22] Filed: Jun. 10, 1983

[51] Int. Cl.³ .......................... H01J 29/70; H01J 29/76
[52] U.S. Cl. ...................................... 315/399; 315/408
[58] Field of Search ...................... 315/382, 31 R, 370, 315/371, 408, 411, 399

[56] References Cited

U.S. PATENT DOCUMENTS

| | | | |
|---|---|---|---|
| 3,931,545 | 1/1976 | Marino | 315/408 |
| 4,088,138 | 5/1978 | Diack et al. | 128/700 |
| 4,227,125 | 10/1980 | Bohringer | 315/411 |
| 4,316,128 | 2/1982 | Shiratsuchi | 315/411 |
| 4,323,826 | 4/1982 | Lehman | 315/408 |
| 4,400,652 | 8/1983 | Sunderland | 315/403 |

OTHER PUBLICATIONS

Zworykin, *Television,* 2nd Edition, Wiley, 1954, pp. 567-568.

*Primary Examiner*—Theodore M. Blum
*Attorney, Agent, or Firm*—Harry R. Lubcke

[57] ABSTRACT

A high efficiency cathode-ray tube magnetic deflection circuit, providing a sawtooth current waveform at a frequency of 100 kilohertz that includes a FET transistor (11) connected to an anti-phased step-down transformer (15,16,17) for driving an output transistor (18). A co-phased step-up transformer (33,34,35) connected to the deflection yoke (19) provides deflection "S" correction, and also a dynamic focus waveform. The transformers have litz wire windings.

9 Claims, 2 Drawing Figures

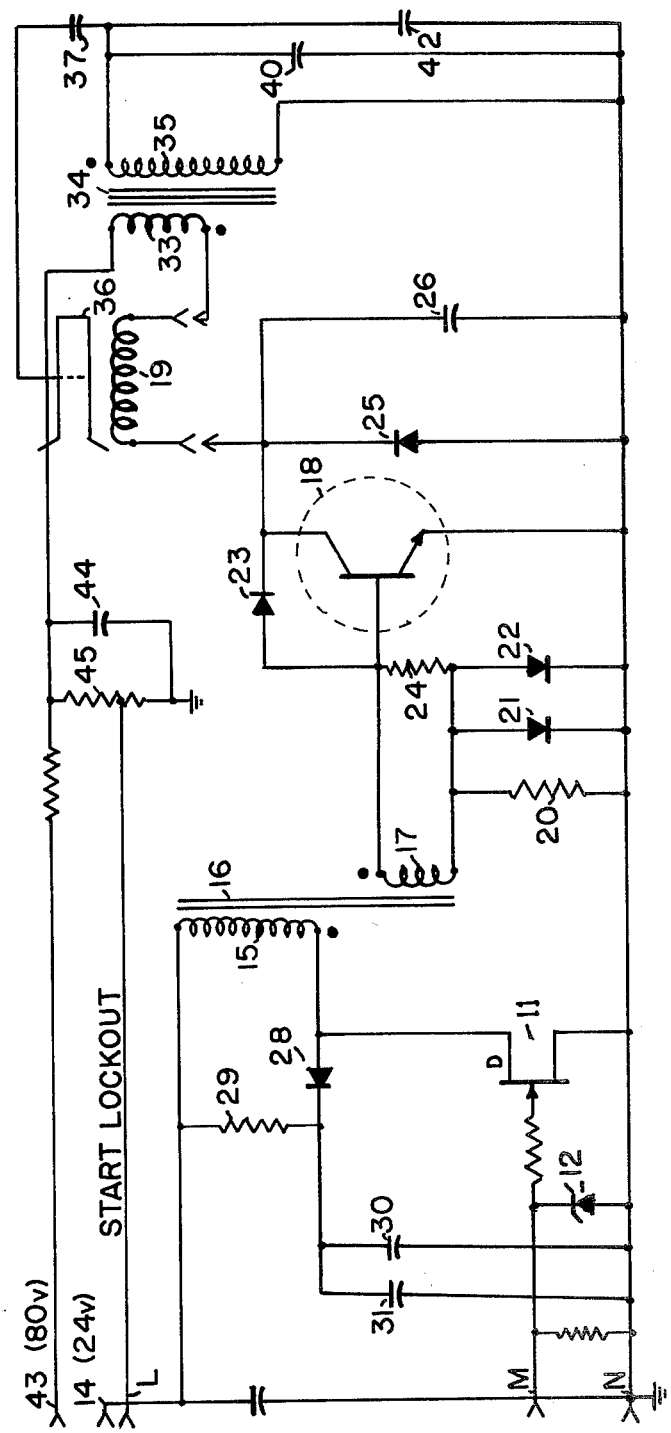

DEFLECTION CIRCUIT

TECHNICAL FIELD

This invention pertains to a high frequency magnetic deflection circuit for forming a raster on a picture cathode-ray tube.

BACKGROUND ART

The "high frequency" horizontal magnetic deflection circuit has been known for several decades. An example is given on pages 567-8 of the book "Television", 2nd Edition, by Zworykin & Morton, Wiley, 1954.

However, the deflection frequency involved there was very low, 15,750 hertz for the usual 525 line, 30-60 field interlaced 2 to 1 for broadcast television.

The present high frequency deflection circuit operates at a selected frequency around 100,000 hertz (100 kilohertz) and requires significantly different circuitry.

SUMMARY OF THE INVENTION

Utilizing a properly timed input pulse, plural one-shot relaxation oscillators connected in cascade provide means for both incremental time delay and driving energy to a transistor. This transistor supplies a driving voltage excursion from the full power supply voltage to ground (essentially). This is to drive a FET transistor that has a step-down transformer in its output circuit. Anti-phased, this transformer drives an output transistor having the horizontal deflection coil and a step-up transformer in its output circuit.

A linear sawtooth of current, of perhaps 16 amperes, flows through a litz wire yoke of 50 microhenry ($\mu$h) inductance to provide deflection of the electron beam.

The step-up transformer provides the known "S" deflection waveform correction for the cathode-ray tube and also a parabolic focus-modulating voltage of a few hundred volts.

The circuit is of high efficiency and the energy loss is correspondingly minimal.

BRIEF DESCRIPTION OF DRAWINGS

FIG. 2 is the same for the final part of the circuit.

BEST MODE FOR CARRYING OUT THE INVENTION

Figure 1:
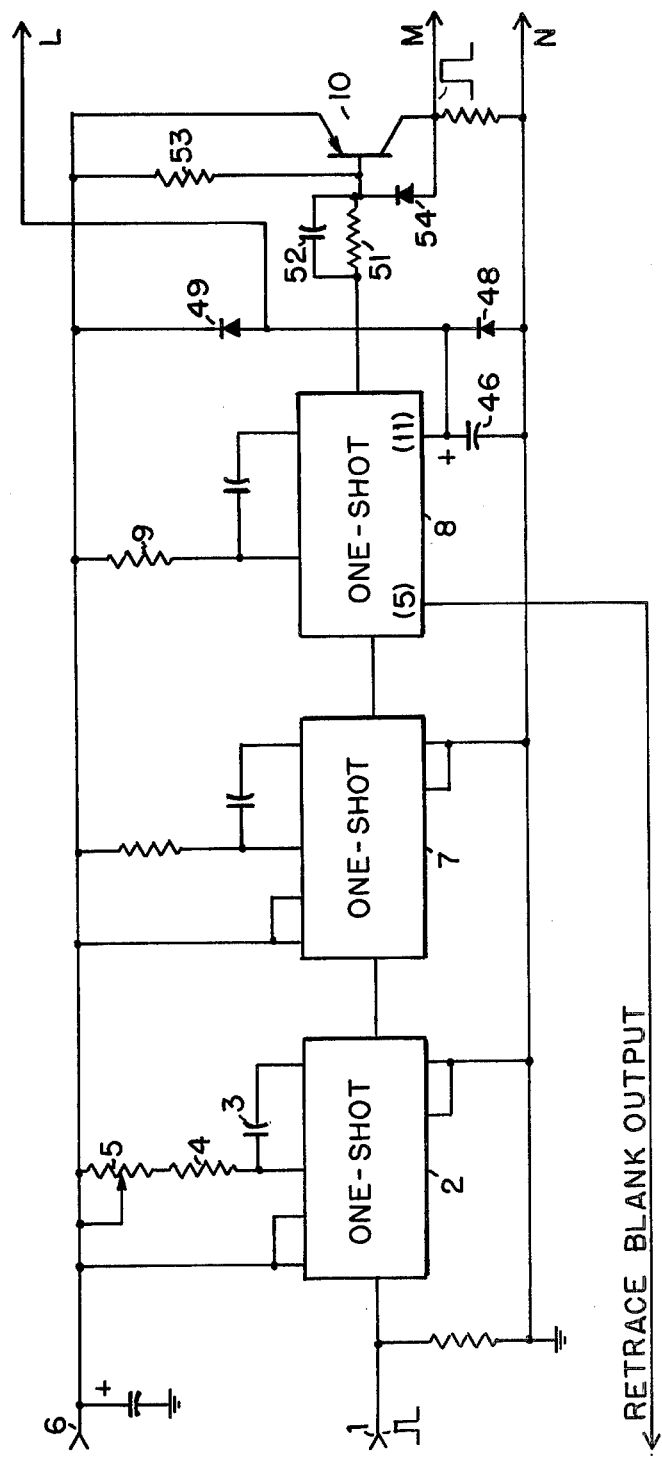
FIG. 1 is a schematic circuit diagram of the initial part of the circuit of the invention.

In FIG. 1, numeral 1 identifies the input drive terminal. Properly timed; i.e., each 1/100,000 second, a pulse having a duration of several microseconds is received from a suitable source, such as TTL logic synchronized to the video signal involved. The pulse is of sufficient duration and amplitude to trigger integrated circuit (IC) 2, typically a relaxation oscillator of the one-shot type. This may be one-half of a type 74LS221 integrated circuit.

Capacitor 3, which may have 390 picofarads (pfd) capacitance completes the one-shot circuit. Resistor 4, typically of 10 kilo-ohms (10 k) connects through variable resistor 5 to power supply terminal 6. The variable resistor has an over-all resistance of 25 k and provides an adjustable delay in the functioning of the whole deflection circuit with respect to the timing of the incoming pulses at terminal 1. This is typically of ±2 microseconds ($\mu$s) maximum delay. Terminal 6 provides d.c. power at 5 volts.

One-shot 7 is connected to one-shot 2 in cascade and contributes to the delay indicated.

One-shot 8 is connected to one-shot 7 in cascade. By means of fixed resistor 9, having an over-all resistance of 10 k, the width of the trigger pulse for transistor 11 is determined.

The output of one-shot 8 passes to the base of switch transistor 10. This is a pulse of nominally 3.2 us duration, which is determined by the value of resistor 9. The transistor may be a ZTX751, a PNP type. The emitter thereof is connected to the +5 volt bus of terminal 6. This allows a voltage at the collector to be within one transistor drop of the +5 volts. This provides a 25% increase in amplitude of the operating pulse over the TTL level of one-shot 8 of 4 volts.

The output pulse from one-shot 8 passes to the base of transistor 10 through a coupling circuit that includes series resistor 51, of 1,000 ohms, shunted by speedup capacitor 52, of 390 pfd.

The base of transistor 10 is returned to the nominally +5 volt terminal 6 through resistor 53, typically of 220 ohms resistance. Diode 54 is a Baker clamp that is connected from the base to the collector of transistor 10, with the cathode of the diode to the base. This is to reduce the switching time of the transistor.

Terminal (5) of one-shot 8 provides a short pulse that can be applied to cathode-ray tube 36 for horizontal retrace blanking; i.e., extinguishing the electron beam therein while the current in the deflection yoke rapidly returns from one extreme amplidude to the other. That is, during the flyback period.

The collector output of transistor 10 is applied to the gate of transistor 11, which is typically a DMOS or VMOS field effect transistor (FET), as a ZVN1209L. Zener diode 12, a 5.6 volts 1N752, for example, protects the gate of the FET from voltage transients, such as might arise in other parts of all of the circuits involved. The zener diode, of course, limits any voltage input to FET 11 to the range between ground and 5.6 volts.

The function of FET 11 is to switch transformer primary 15 to ground, thus completing that circuit from +24 volt d.c. power supply terminal 14, and allowing current to flow.

The period of time the transformer is ON is set by drive width resistor 9, nominally 3.2 $\mu$s, such as with the fixed value of 10 k previously stated herein.

A FET rather than a bipolar device is used for transistor 11 because the FET allows a voltage drive for obtaining a current switching function, and because the FET is a very fast ON and OFF device. The power dissipation therein is thus negligible.

In this circuit, novel means are employed to reduce all power dissipation, since the heating due to high deflection currents would otherwise be destructive of circuit components. Additionally, the over-all power required is thus minimal in view of the task of providing deflection at 100 kilohertz.

Core 16 is preferably of ferrite material and of toroidal shape, having an outer diameter of approximately 3 centimeters (cm), and a circular cross-section of 0.8 cm. Upon this primary 15 is wound, of 38 turns of 200 strands of No. 44 litz wire. Upon that secondary 17 is wound, having 6 turns of 200 strands No. 44 litz wire. Although the secondary typically supplies 4 amperes of 100 kilohertz current the transformer operates cool to the touch.

The purpose of secondary 17 is to energize power transistor 18, between base and ground, for driving horizontal deflection winding 19 of the cathode-ray tube yoke.

A proper d.c. bias is established upon the base of transistor 18 by resistor 20, typically of 2 ohms resistance, which resistor is shunted by two silicon diodes 21 and 22 in parallel.

A Baker clamp 23 is connected from the collector to the base of transistor 18, typically having one 1000 volt rating diode, with the cathode connected to the collector of the transistor. This clamp reduces the switching time of power transistor 18.

Resistor 24, typically of 39 ohms resistance, is shunted across secondary winding 17 to enhance the transient-free operation of the transformer.

Damper diode 25 is connected from emitter to collector of transistor 18 to absorb the negative voltage excursion on the collector at the end of the flyback time of the waveform.

Similarly connected is capacitor 26, which may be of the polypropylene type, having a capacitance of 6800 picofarads (pf) and a 2 kilovolt rating, such as the Sprague 715P. This capacitance resonates with the 50 microhenry (82 h) inductance of deflection yoke winding 19 and generates the flyback period of the deflection current wave-form.

In the operation of FET 11 and the transformer primary 15, after the FET no longer grounds the winding, as after 3.2 us, the potential proceeds to rise toward the 24 volt supply of terminal 14. Further, the energy in the transformer causes the voltage to go higher than that of terminal 14, in one practical embodiment to 35 volts.

Diode 28 anode is connected to the FET side of winding 15, while the cathode is connected to terminal 14 through resistor 29, typically 47 ohms, and also to charge storage capacitors 30 and 31. The former capacitor has a capacitance of 100 $\mu$f and the latter a capacitance of 0.1 $\mu$f.

The anti-phase connections of transformer primary 15 and secondary 17 is indicated by dots at the active and inactive ends, respectively, of these windings. This results in transistor 18 being ON when FET 11 is OFF. This gives high power efficiency, since FET 11 is ON for only a short period of time during the nominal 11 $\mu$s of the whole duration of the scan line, but the horizontal output transistor 18 is necessarily ON. Transistor 18 is a mode type suited for efficient operation in high frequency scanning circuits.

It will be noted that first transformer 15, 16, 17 isolates FET 11 from any d.c. abnormalities that might occur beyond secondary 17.

Yoke 19 is preferably of the stator wound type with the horizontal deflection winding utilizing litz wire. The use of litz wire, also known as "Litzendraht, braided wire", rather than the usual solid wire, greatly reduces heating and other losses at the 100 Khz frequency. This is because of the reduction of the "radio frequency" resistance due to the "skin effect" experienced with a solid wire.

A linear current occurs in the yoke winding because the sawtooth current is "pulled" constantly throughout the whole horizontal deflection period.

A step-up transformer having primary 33, core 34 and secondary 35 is connected with the primary in series with the horizontal deflection yoke winding 19. The primary has 6 turns and the secondary has 100 turns, both wound with litz wire, as before. The core is a ferrite toroid approximately 2.2 cm in diameter with a 0.63 cm diameter cross-section.

This transformer provides an "S" scan correction to retain linear deflection with a preferred 110° deflection angle cathode-ray tube shown fragmentarily at 36.

In the prior art, one system for producing this correction has employed an active transistor in series with the deflection yoke that was modulated by a parabolic waveform to vary the deflection current during the horizontal scans.

The present transformer also provides parabolic dynamic focus correction for the electron beam of the cathode-ray tube 36 herein employed. This is accomplished by secondary 35 being shunted by capacitors 40 and 42, both being of 1500 pf capacitance. Typically, a parabolic waveform of 400 volts is formed. Secondary 35 is also a.c. connected to the focus electrode within the cathode-ray tube through capacitor 37, which may have a capacitance of 100 pf. An algebraic addition to the basic focus voltage is provided.

It will be noted that two corrections are herein accomplished with the one passive transformer 33, 34, 35. The dynamic focus correction is simplified. Importantly, the amplitude thereof remains optimum regardless of scan adjustments to the width of the image.

The terminal of transformer primary 33 that is not connected to deflection yoke 19 is connected to a d.c. voltage supply at terminal 43 of approximately 80 volts. Also connected thereto is capacitor 44, of approximately 68 ufd, in shunt to ground and resistor 45 of approximately 100 k ohms. A tap thereon at approximately 2.7 k ohms connects to capacitor 46, of 100 $\mu$fd. and diode 48, poled with the anode to ground. Further, the non-ground terminal of capacitor 46 is connected to terminal (11) of one-shot 8 and to the +5 volt power supply terminal 6 through diode 49, which is poled with the cathode to terminal 6.

Capacitor 46 and resistor 45 act as a charging network to one-shot 8 and the associated circuit to assure that power supply voltage is applied to horizontal output transistor 18 before drive pulses are applied thereto.

Specific values have been given herein for circuit components for the purpose of illustrating a preferred embodiment. Nominal departures may be taken from the values given without impairing the concept or the operability of the invention.

I claim:
1. A cathode-ray tube magnetic deflection circuit, comprising;
   (a) plural interconnected triggerable relaxation oscillator means (2,7,8),
   (b) FET means (11) connected to said oscillator means,
   (c) a step-down transformer (15,16,17), connected to said FET means,
   (d) transistor means (18) connected to said step-down transformer, for actuation thereby,
   (e) a cathode-ray tube deflection yoke (19) connected to said transistor means, and
   (f) a step-up transformer (33,34,35) also connected to the deflection yoke
for modifying the scanning velocity of the cathode-ray tube beam to result in a linear scanning deflection.
2. The deflection circuit of claim 1, in which;
   (a) said plural triggerable relaxation oscillator means (2,7,8) are one-shot oscillators, and
   (b) the one-shot oscillators are connected in cascade.
3. The deflection circuit of claim 1, in which;

(a) a sawtooth waveform of current of approximately 100 kilohertz frequency is caused to flow through the deflection yoke (19).

4. The deflection circuit of claim 1, which additionally includes;

(a) a parabolic waveforming circuit (40,42) connected to said step-up transformer (35) and to the focus means of the cathode-ray tube (36), for maintaining the focus of the beam constant with deflection thereof by current in said deflection yoke.

5. The deflection circuit of claim 1, which additionally includes;

(a) a transistor (10) connected as the output of the last said plural triggerable relaxation oscillator means, and (b) directly to a voltage source (6), whereby the voltage output of said transistor is approximately equal to the voltage of said source.

6. The deflection circuit of claim 1, in which;

(a) said step-down transformer (15,16,17) has a turns ratio of approximately 6 to 1, and (b) the secondary (17) is anti-phased with respect to the primary (15).

7. The deflection circuit of claim 6, in which;

(a) the windings (15,17) of said step-down transformer are wound with litz wire, and (b) the core (16) of said step-down transformer is a ferrite toroid.

8. The deflection circuit of claim 1, in which;

(a) said step-up transformer (33,34,35) has a turns ratio of approximately 16 to 1, and (b) the secondary (35) is co-phased with respect to the primary (33).

9. The deflection circuit of claim 8, in which;

(a) the windings (33,35) of said step-up transformer are wound with litz wire, and (b) the core (34) of said step-up transformer is a ferrite toroid.

* * * * *